United States Patent [19]

Erkman

[11] 4,453,123
[45] Jun. 5, 1984

[54] SYSTEM FOR PROVIDING A FIRING SIGNAL TO AN ELECTRICAL POWER SWITCH

[76] Inventor: Ronald E. Erkman, 1906 Gold Ave. SE., Albuquerque, N. Mex. 87106

[21] Appl. No.: 315,305

[22] Filed: Oct. 27, 1981

Related U.S. Application Data

[63] Continuation of Ser. No. 197,642, Oct. 16, 1980, abandoned.

[51] Int. Cl.³ .............................................. G05F 5/00
[52] U.S. Cl. ................................ 323/324; 307/252 B; 315/291
[58] Field of Search ...................... 323/300, 324, 326; 315/291; 307/252 B, 252 T

[56] References Cited

U.S. PATENT DOCUMENTS

| | | | |
|---|---|---|---|
| 3,684,919 | 8/1972 | Cramer | 307/252 T |
| 3,793,557 | 2/1974 | Cramer | 307/252 B |
| 3,816,797 | 6/1974 | Skirpan | 315/291 |
| 4,004,214 | 1/1977 | Evans | 323/300 |
| 4,168,476 | 9/1979 | Petrizio | 323/300 |
| 4,238,723 | 12/1980 | Jenks | 323/326 |
| 4,311,956 | 1/1982 | Tolmie | 323/326 |

FOREIGN PATENT DOCUMENTS 1288790  9/1972  United Kingdom ............ 307/252 B

Primary Examiner—William H. Beha, Jr.

[57] ABSTRACT

A system for providing a firing signal to an electrical power switch at a selectable instant during each cycle of a periodic waveform electric power source. A comparator receives a signal varying monotonically with time and a control voltage as inputs, and produces the firing signal at such time that one of these inputs first exceeds the other. The control voltage is clamped to a predetermined value to provide a minimum power output from the electrical power switch.

3 Claims, 2 Drawing Figures

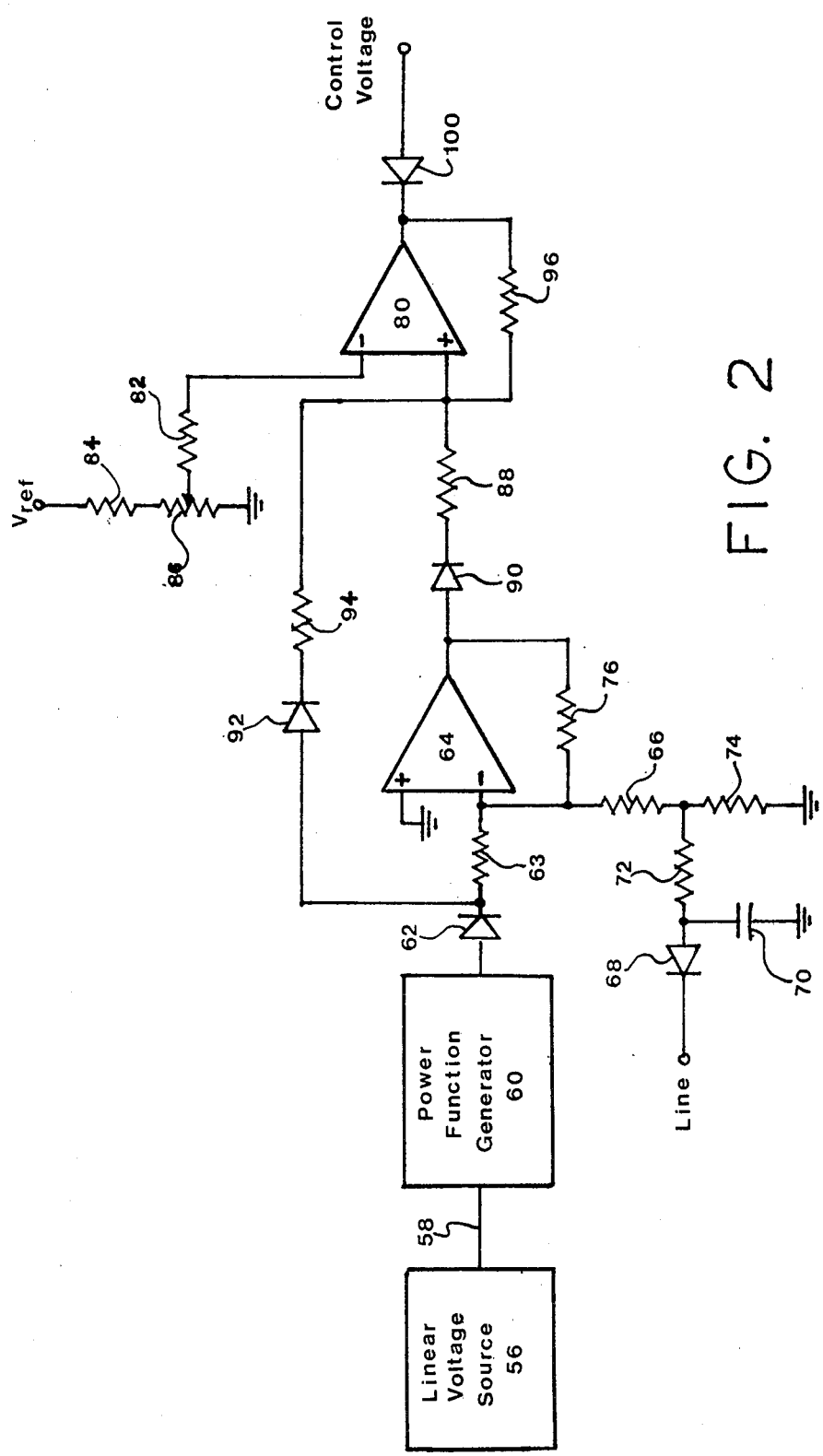

SYSTEM FOR PROVIDING A FIRING SIGNAL TO AN ELECTRICAL POWER SWITCH

This is a continuation of application Ser. No. 197,642, filed Oct. 16, 1980, now abandoned.

BACKGROUND OF THE INVENTION

The present invention relates to circuitry for controlling the power level provided to a load from a periodic waveform electric power source.

In many applications, such as stage and television lighting, it is desirable to provide a power control circuit which maintains a predetermined power output to the load under all conditions. For example, by maintaining a minimum energization of a lamp load, the lamps can be made to respond quickly when the operator desires to increase the light output, since the lamp filaments are not permitted to cool down completely. In certain applications, such as television lighting, it is desirable to maintain a minimum light output just above the threshold of the television camera's response.

In different applications and, for a given application under different conditions, the desired relationship between the position of the operator actuated control and the power output to the load varies. For example, in stage lighting applications, it is known that the human eye generally perceives light intensity to vary approximately in proportion to the square of the RMS output voltage to the lamp. However, the eye's sensitivity to changes in light levels varies inversely with the ambient light level. For television lighting, on the other hand, it is found that the camera reacts quite differently than the eye to changes in light intensity, thus necessitating yet another functional relationship between operator control position and the output voltage to the lamp.

In the prior art, various methods have been attempted to provide the design flexibility necessary for adapting the control circuitry to such variable conditions of operation. In one method, this functional relationship consists of a piecewise linear approximation to the desired response curve. In order to closely approximate the desired response curve, it is necessary to produce an actual response consisting of a relatively large number of linear segments. This technique, this, results in relatively complex circuitry and a commensurately high cost of production.

SUMMARY OF THE INVENTION

In accordance with an embodiment of the present invention, a system is provided which produces a firing signal for triggering an electrical power switch at a selectable instant during each cycle of a periodic waveform electric power source. A comparator means receives a voltage varying monotonically with time from a voltage source and a selectively variable voltage from a control means as inputs, and produces the firing signal at such time that one of these inputs first exceeds the other. The control means comprises means for clamping the selectively variable voltage to a predetermined value so that a predetermined minimum power output from the electrical power switch is maintained. Accordingly, it is possible to ensure a quick response from a load, such as an incandescent lamp, when the power applied to it is increased. Moreover, it is readily possible to provide a minimum power level to a lamp load in order to maintain the minimum light output therefrom at a desired intensity.

In accordance with a further aspect of the embodiment, a linear voltage source provides a voltage varying in proportion to the position of an operator actuable control. A power function generator is coupled to the linear voltage source to receive the proportionate voltage and provides a voltage at its output varying as a selectable power function of the proportionate voltage. The output voltage of the power function generator is provided to the comparator as the selectively variable voltage. It is thus possible to adjust the relationship between the operator control and the selectively variable voltage through a continuum of functional relationships. Accordingly, the functional relationship may be selected as a precise analog of the desired square law relationship for stage lighting purposes, while for different applications such as television lighting, the desired power function relationship is just as easily and precisely achieved.

BRIEF DESCRIPTION OF THE DRAWINGS

FIGS. 1 and 2 together provide a block diagram representation of a preferred power control circuit in accordance with the present invention.

DESCRIPTION OF A PREFERRED EMBODIMENT

Figure 1:
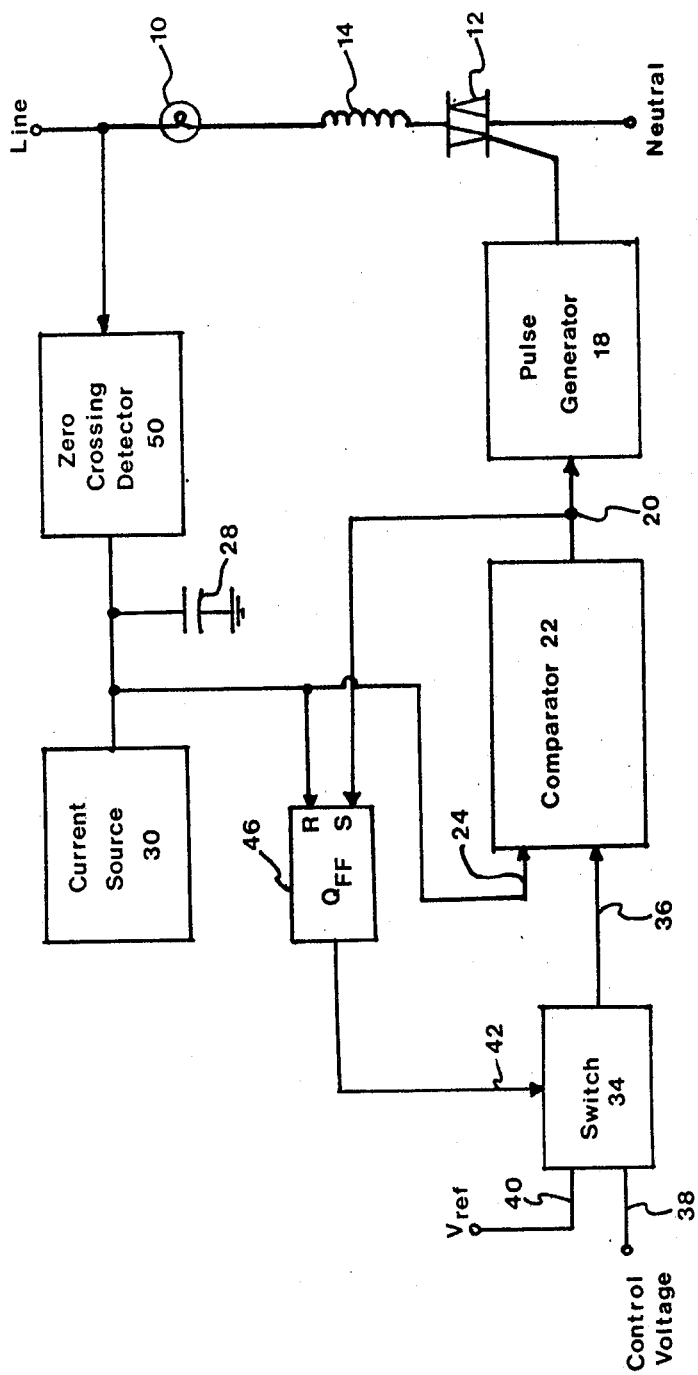

With reference first to FIG. 1, a lamp load 10 is connected in series with the main terminals of a triac 12 and an inductor 14 across the line and neutral terminals of a periodic waveform electric power source. Triac 12 operates to switch on the lamp 10 at a selected point during each half cycle of the power line voltage in order to regulate the average power provided to lamp 10. Inductor 14 suppresses high frequency transient voltages produced by the switching of triac 12.

The switching of triac 12 during each half cycle of the line voltage is controlled by a pulse provided to the gate of triac 12 from the output of a pulse generator 18. The timing of the pulse or firing signal from generator 18 is controlled by the occurence of a shift in polarity of the voltage appearing on an output terminal 20 of a comparator 22.

Comparator 22 has a first input terminal 24 coupled to receive a voltage varying monotonically with time from a voltage source comprising a capacitor 28 and a current source 30. Capacitor 28 has a first terminal connected to terminal 24 and a second terminal connected to ground. The first terminal of capacitor 28 is also connected to the output of current source 30. Current source 30 preferably provides a constant negative current to capacitor 28 so that the voltage thereacross and, accordingly, the voltage appearing at terminal 24 of comparator 22 decreases at a constant rate with time.

An electronic switch 34 has a single output connected to a second input terminal 36 of comparator 22. Switch 34 has a first input terminal 38 connected to a control circuit shown in FIG. 2 and described hereinbelow, from which it receives a selectively variable voltage or control voltage. A second input terminal 40 of switch 34 is connected to a source of reference voltage Vref. Switch 34 also has a control terminal 42 connected to the Q terminal of a RS flip flop 46. The set terminal of flip flop 46 is connected to output terminal 20 of comparator 22 and the reset terminal of flip flop 46 is connected to the first terminal of capacitor 28.

A zero crossing detector 50 has an input terminal connected to the line terminal and an output terminal connected to the first terminal of capacitor 28. Zero crossing detector 50 senses the beginning of each half cycle of the line voltage and briefly grounds the first terminal of capacitor 28 at that time to reset the voltage across capacitor 28 to zero. Flip flop 46 senses the rapid rise in voltage across capacitor 28 at the reset terminal and causes switch 34 to connect the control voltage at its terminal 38 to input terminal 36 of comparator 22.

The control voltage is adjusted as described below to a negative value such that, as the voltage across capacitor 28 and therefore, at input terminal 24 of comparator 22 decreases, a point in the half cycle is reached when the voltages at terminals 24 and 36 cross. At this point, the voltage at output terminal 20 of comparator 22 changes abruptly, causing pulse generator 18 to produce a firing signal or pulse at the gate of triac 12. Triac 12 thus becomes conductive, turning on lamp 10. Triac 12 remains conductive until the end of the half cycle, at which it turns off.

The voltage transition at the output 20 of comparator 22 occurring at the turn-on or firing point of triac 12, is sensed at the set terminal of flip flop 46, causing the Q terminal thereof to switch to the new set state. This in turn causes switch 34 to connect the reference voltage Vref to input terminal 36 of comparator 22, and to disconnect the control voltage therefrom. Vref is selected at a negative value below the permitted range of the control voltage on input terminal 38. Accordingly, as the voltage at terminal 36 once again falls below that on terminal 24, the voltage on output terminal 20 of comparator 22 shifts polarity. This occurence is sensed by pulse generator 18 which then operates to terminate the pulse to the gate of triac 12. Vref is selected at a value sufficiently low to ensure that the voltage across capacitor 28 cannot fall below Vref before the end of the half cycle which would result in the production of a second pulse by generator 18.

With reference to FIG. 2, a circuit is illustrated for providing a selectively variable voltage or control voltage for controlling the timing of pulse generation by the circuit of FIG. 1. A variable input voltage is provided by a linear voltage source 56 at an output terminal 58. The input voltage is made to vary in proportion to the position of an operator actuable control (not shown).

A power function generator 60 is connected to output terminal 58 to receive the input voltage and provides a voltage at its output terminal 62 which varies as a selectable power function of the input voltage. Power function generator 60 may be formed in a conventional array comprised of a logarithmic converter and an antilogarithmic generator each coupled to receive a complementary percentage of the input voltage. By adjusting the percentage of the input voltage applied to the converter and to te generator, the relationship of the output voltage of the power function generator 60 to the input voltage is defined. Thus, the circuit of the present invention is adaptable to a wide range of lighting control applications, while achieving the desired operational response in each application using a relatively uncomplicated embodiment.

A summing amplifier 64 has a non-inverting input terminal connected to ground and an inverting input terminal coupled to the output of power function generator 60 through a summing resistor 63 and a diode 62. In order to maintain the power to the lamp 10 constant despite variations in the line voltage, a feedback network provides a scaled down, rectified negative feedback voltage from the line terminal to a second summing resistor 66 connected to the inverting input terminal of amplifier 64. The negative feedback network comprises a rectifying diode 68 having one terminal connected to the line terminal and a second terminal connected to one terminal of a smoothing capacitor 70. The other terminal of smoothing capacitor 70 is connected to ground. A resistive voltage divider, comprising series resistors 72 and 74, is connected to the second terminal of diode 68 and provides a scaled-down, rectified negative feedback voltage to summing amplifier 64 through second summing resistor 66. The gain of amplifier 64 is determined by a feedback resistor 76 connected between its inverting input terminal and its output terminal.

A voltage clamping amplifier 80 has an inverting input terminal coupled through an input resistor 82 to a variable reference voltage source. The reference voltage source conprises a fixed resistor 84 having one terminal connected to Vref and a second terminal connected to one fixed terminal of a potentiometer 86, the other fixed terminal of potentiometer 86 being connected to ground. Input resistor 82 is connected to the wiper arm of potentiometer 86, thus to couple a variable reference voltage to the inverting input terminal of amplifier 80.

The amplifier 80 has a non-inverting input terminal coupled to the output of amplifier 64 through the series connection of a first input resistor 88 and a first blocking diode 90. To provide improved circuit stability by permitting a reduced voltage swing at the output of amplifier 64, the output voltage of power function 60 is provided to the non-inverting input terminal of amplifier 80 through diode 62, a second blocking diode 92 and a second input resistor 94. A feedback resistor 96 connected between the output of amplifier 80 and the non-inverting input terminal thereof determines the amplifier gain.

It will be appreciated that should the voltage appearing at the non-inverting input terminal of amplifier 80 cross the variable reference voltage level, the output voltage of amplifier 80 will abruptly change its polarity. Accordingly, a further blocking diode 100 is connected to the output of amplifier 80 to block output voltages therefrom which fall below the variable reference voltage level. The voltage appearing at the output of diode 100 is provided as the control voltage to terminal 38 of switch 34.

By adjusting the wiper arm of potentiometer 86, the operator is thus enabled to set the minimum value of the control voltage, and to thereby fix the minimum power output to the lamp 10 as desired.

I claim:

1. A system for providing a firing signal to an electrical power switch at a selectable instant during each cycle of a periodic waveform electric power source, comprising:

a voltage source providing a voltage varying monotonically with time;

control means providing a selectively variable voltage; and comparator means coupled with the voltage source to receive the monotonically varying voltage and with the control means to receive the selectively variable voltage, for providing the firing signal at such time that one of the monotonically varying voltage and the selectively variable voltage first exceeds the other;

the control means comprising means for clamping the selectively variable voltage to a predetermined value for producing a predetermined minimum power output from the electrical power switch.

2. The system of claim 1, wherein the control means further comprises a source of variable input voltage, and the clamping means comprises an amplifier having an inverting terminal, a noninverting input terminal and an output terminal, the input voltage source being coupled to one of said inverting and noninverting input terminals, a reference voltage source being coupled to the other of said inverting and noninverting input terminals to provide a reference voltage level thereat equal to the predetermined value of the selectively variable voltage, and rectifier means having an input coupled to the output of the amplifier and an output, for blocking output voltages from the amplifier which exceed the reference voltage level in a predetermined direction, whereby the clamped selectively variable voltage is provided at the output of the rectifier means.

3. A system for providing a firing signal to an electrical power switch at a selectable instant during each cycle of a periodic waveform electric power source, comprising:

a voltage source providing a voltage varying monotonically with time;

a linear voltage source providing a voltage varying in proportion to the position of an operator actuable control;

a power function generator coupled to the linear voltage source to receive the proportionate voltage and operative to provide a voltage at its output varying as a selectable power function of the proportionate voltage; and comparator means coupled with the voltage source to receive the monotonically varying voltage and with the power function generator to receive the output voltage therefrom, for providing the firing signal at such time that one of the monotonically varying voltage and the output voltage from the power function generator first exceeds the other.

* * * * *